(12) United States Patent
Tailliet et al.

(10) Patent No.: US 10,068,644 B2
(45) Date of Patent: Sep. 4, 2018

(54) SYSTEM AND METHOD FOR ADJUSTING EEPROM WRITE CYCLE DURATION ACCORDING TO SUPPLY VOLTAGE VARIATION

(71) Applicant: STMicroelectronics (Rousset) SAS, Rousset (FR)

(72) Inventors: François Tailliet, Fuveau (FR); Marc Battista, Marseilles (FR)

(73) Assignee: STMICROELECTRONICS (ROUSSET) SAS, Rousset (FR)

(*) Notice: Subject to any disclaimer, the term of this patent is extended or adjusted under 35 U.S.C. 154(b) by 0 days.

(21) Appl. No.: 15/054,015

(22) Filed: Feb. 25, 2016

(65) Prior Publication Data

US 2017/0092357 A1 Mar. 30, 2017

(30) Foreign Application Priority Data

Sep. 24, 2015 (FR) ...................... 15 59017

(51) Int. Cl.
*G11C 13/00* (2006.01)

(52) U.S. Cl.
CPC ...... *G11C 13/0097* (2013.01); *G11C 13/0069* (2013.01)

(58) Field of Classification Search
CPC . G11C 13/0097; G11C 13/0069; H03K 21/00
USPC ........................................................ 365/148
See application file for complete search history.

(56) References Cited

U.S. PATENT DOCUMENTS

| 5,592,429 A * | 1/1997 | Hirata | G11C 16/225 365/185.22 |
| 5,729,494 A | 3/1998 | Gotou et al. | |
| 5,995,416 A * | 11/1999 | Naura | G11C 16/12 365/185.18 |
| 6,040,994 A * | 3/2000 | Naura | G11C 16/10 365/185.18 |
| 6,044,015 A | 3/2000 | Van Houdt et al. | |
| 6,188,616 B1 * | 2/2001 | Na | G11C 7/1078 365/189.05 |
| 6,735,117 B2 * | 5/2004 | Ott | G11O 5/143 365/185.18 |
| 7,012,837 B2 * | 3/2006 | Naura | G11C 8/08 365/185.19 |
| 7,330,373 B2 * | 2/2008 | Lee | G11O 5/145 365/185.03 |
| 7,457,146 B2 * | 11/2008 | Philipp | G11C 11/56 365/148 |
| 8,310,300 B2 * | 11/2012 | Cook | H02M 3/07 327/536 |
| 2002/0126534 A1 * | 9/2002 | Naura | G11C 16/12 365/185.18 |
| 2005/0207229 A1 | 9/2005 | Takeuchi | |

(Continued)

FOREIGN PATENT DOCUMENTS

EP 1783778 A1 5/2007

*Primary Examiner* — Hoai V Ho
*Assistant Examiner* — Muna A Techane
(74) *Attorney, Agent, or Firm* — Slater Matsil, LLP

(57) ABSTRACT

A method of controlling a cycle for writing at least one data item to at least one memory slot of the electrically programmable and erasable read-only memory type disposed in an electronic circuit supplied by a supply voltage includes a controlled increase of the duration of the write cycle in the presence of a decrease in the supply voltage.

21 Claims, 2 Drawing Sheets

(56) References Cited

U.S. PATENT DOCUMENTS

| | | |
|---|---|---|
| 2005/0207230 A1 | 9/2005 | Naura et al. |
| 2007/0237008 A1 | 10/2007 | Lee et al. |
| 2009/0066483 A1* | 3/2009 | Naura ................ G06K 19/0713 340/10.51 |
| 2011/0194364 A1 | 8/2011 | Nirschl et al. |
| 2012/0155168 A1* | 6/2012 | Kim ........................ G11C 5/14 365/185.03 |
| 2015/0117098 A1 | 4/2015 | Shlick et al. |

* cited by examiner

SYSTEM AND METHOD FOR ADJUSTING EEPROM WRITE CYCLE DURATION ACCORDING TO SUPPLY VOLTAGE VARIATION

This application claims priority to French Application No. 1559017, filed on Sep. 24, 2015, which application is hereby incorporated herein by reference.

TECHNICAL FIELD

Modes of implementation and embodiments of the invention relate to memories, in particular non-volatile memories of electrically erasable and programmable (EEPROM) type, and more particularly to the control of their write cycles.

BACKGROUND

A memory slot of EEPROM type generally comprises a transistor having a floating gate allowing the storage of the data item, a drive gate, a source region and a drain region. Such a memory slot uses the principle of nonvolatile storage of charge on the floating gate of the transistor.

Conventionally, the operation or cycle for writing a data item comprises an erasure step followed by a programming step. Programming is achieved through the Fowler-Nordheim effect by using a voltage pulse having a high value, typically of the order of 13 to 15 volts, injecting electrons from the floating gate to the drain through the tunnel effect.

Erasure is also achieved through the Fowler-Nordheim effect, electrons being injected through the tunnel effect from the drain to the floating gate, and is also performed by using an erasure pulse similar to the programming pulse.

The programming and erasure pulses are customarily generated in the form of a ramp followed by a plateau, by pulse generators conventionally comprising one or more charge pump stages.

However, it is possible for the fan-out of the charge pump to be insufficient to attain the voltage levels necessary for the Fowler-Nordheim effect, in particular because of too low a supply voltage and because of current leakages. This translates into a writing error and an impairment of the data.

The current consumed during a write operation that the charge pump will have to provide can be expressed as a continuous component (DC) and a dynamic component (AC).

The continuous component of the consumed current originates essentially from the leakage currents internal to the transistors receiving the high voltage during the write operations, and if appropriate from the wells in which these transistors are positioned.

The dynamic component of the consumed current originates from the charge of the various parasitic capacitances originating from the hardware components and the interconnections receiving the high voltage during the write operations.

In practice, it is possible to express the current consumed by the charge pump according to equation (1):

$$Ip = (Ic + Ctot \cdot dV/dt) \cdot (Vpp/Vdd) \cdot 1/\text{Eff} \quad (1)$$

where Ip represents the consumed current, Ic the continuous component of this consumed current, Ctot the equivalent capacitance of the nodes of the circuit receiving the high voltage, dV/dt represents the slope of the ramp, Vpp represents the output high voltage, Vdd represents the supply voltage, and Eff represents the efficiency of the charge pump.

Operational needs exist in respect of memories of EEPROM type at low supply voltages, for example substantially 1.6 volts, in particular in "wireless" systems such as for example computer mice or keyboards, or hearing aid prostheses.

In practice, operations at low supply voltage Vdd often also require a low supply current. High consumptions of current Ip are therefore prejudicial to systems whose supply voltage is low.

Now, in accordance with equation (1), the current consumed is all the more sizable the larger the term Vpp/Vdd and therefore the lower the supply voltage Vdd.

Moreover, needs exist in respect of EEPROM type memory writing at high frequency, or short write time, for example substantially 1 ms per write cycle, in particular in high density memory systems.

Now, in accordance with equation (1), the current consumed is all the more sizable the larger the term dV/dt and therefore the shorter the write time provided.

Finally, it is often required that one and the same memory be capable of operating in a wide span of supply voltages, typically from 1.6 volts to 5.5 volts.

At present, pulse generators dimensioned to be reliable according to a short write time at low voltage, for example 1.6V, are consequently over-dimensioned when operating at high voltage, typically above 2.5 volts. They consequently require a sizable area and lack efficiency at high voltage while generating sizable, potentially detrimental, current spikes.

SUMMARY

According to one mode of implementation and embodiment, there is proposed a memory of EEPROM type capable of operating in an efficient manner, in particular as regards the charge pump, in a wide span of supply voltages, for example 1.6 volts-5.5 volts.

A proposed solution comprises a controlled adaptation of the write time as a function of the supply voltage, thereby allowing the pulse generator, in particular the charge pump, of the memory to operate in an efficient manner both at low voltage and at high voltage, without over-dimensioning of the charge pump, this translating into a gain in space.

According to one aspect, there is proposed a method of controlling a cycle for writing at least one data item to at least one memory slot of the electrically programmable and erasable read-only memory type disposed in an electronic circuit supplied by a supply voltage, comprising a controlled increase of the duration of the write cycle in the presence of a supply voltage decrease.

The controlled increase of the duration of the write cycle makes it possible to ensure that the writing of the memory slots is correct, even in case of low supply voltage.

The increase is controlled in the sense that it is performed intentionally and adjusted as a function of the amplitude of the dip in the supply voltage and therefore as a function of the current value of the supply voltage.

Whereas it is possible to envisage a continuous increase of the write time as a function of the decrease in the supply voltage, it is preferable for practical reasons that the increase in the duration of the write cycle comprise an increase by at least one step corresponding respectively to at least one step value of the supply voltage lower than a nominal value.

In order to detect a need for modification of the write time, there is proposed at least one comparison of the current value of the supply voltage with the at least one step value.

The at least one comparison can be carried out before the beginning of the write cycle, thereby making it possible to carry out the write cycle in an optimized configuration as regards duration of writing and reliability.

As indicated hereinabove, whereas the write operation generally comprises an erasure step followed by a programming step, it is possible, in certain cases, that a single erasure or programming step be necessary to write a word to the memory. For example, if the word to be written contains only "0"s, then only an erasure step is necessary, and likewise, when the word 0F (in hexadecimal notation) has to be replaced with the word 1F, the erasure step is irrelevant.

Thus, when the write cycle comprises a generation of at least one erasure or programming pulse, the increase in the duration of the write cycle comprises an increase in the duration of the at least one pulse.

When the write cycle comprises an erasure step comprising a generation of an erasure pulse followed by a programming step comprising a generation of a programming pulse, the increase in the duration of the write cycle can comprise an increase in the duration of each pulse.

The pulse generating generator generally comprises one or more charge pump stages associated with a charge pump regulation, and generate a high-voltage pulse, customarily in the form of a ramp followed by a plateau.

The regulation makes it possible to control the output voltage of the charge pump. The regulation level may be for example the voltage level of the plateau, typically 15 volts.

The duration of the pulse (ramp+plateau) is driven by an analog or digital chronometer ("timer").

As is conventional, the programming or erasure pulse, generated by the charge pump stage or stages and the associated regulation, is applied to a circuit exhibiting a capacitive charge in addition to leakage currents.

When the supply voltage decreases, the fan-out of the charge pump decreases steeply.

And when the fan-out of the charge pump is low, its current may be for example lower than the current necessary for the capacitive charge, in which case the pace of the ramp slackens off and takes a curved shape. The plateau is then naturally shortened, the duration of the pulse being fixed by the chronometer.

When the fan-out of the charge pump is low, its current may also be lower than the leakage currents and the voltage of the plateau necessary for the write operation is then not attained.

These two alternatives may also be compounded.

Stated otherwise, the lower the supply voltage, the more time the pulse generator take to provide the desired value of the plateau, the duration of the plateau risks being too short and/or its amplitude insufficient, and writing risks being incorrect.

Thus, it is proposed that, in case of low voltage, the time allocated to the ramp by the chronometer be sufficiently long for the generation of the ramp not to encroach on the time allocated to the plateau.

Stated otherwise, the increase in the duration of the at least one pulse can comprise an increase in the duration of the corresponding ramp.

The duration of generation of the plateau is then sufficient for reliable writing, and this makes it possible to preserve correct charge pump fan-out by decreasing the size of the term dV/dt of equation (1) mentioned hereinabove.

Nonetheless, it may be advantageous to increase the duration of the plateau in proportion to the increase in the duration of the ramp.

Indeed, in certain approaches, the duration of the ramp and the total duration of the pulse are defined by two independent analog circuitries that may lead to decorrelated variations of durations. The proposed solution makes it possible to circumvent the risks related to the decorrelation of the variations.

Thus, the increase in the duration of the at least one pulse can comprise an increase in the duration of the plateau.

Advantageously in regard to energy consumption in particular, the write operation is not impaired if the value of the plateau voltage decreases but its duration increases.

Thus, the increase in the duration of the at least one pulse can comprise a decrease in the voltage of the plateau.

This makes it possible to adapt the consumption of current of the block supplied by the charge pump, to a reduced fan-out of the charge pump for low supply voltages. Indeed the reduction in the amplitude of the plateau contributes to reducing the continuous component of the current consumed by the charge pump.

According to one mode of implementation, the duration of the ramp is fixed at a nominal duration if the supply voltage is greater than the step value and is greater than the nominal duration if the supply voltage is lower than the step value.

By way of non-limiting example, the nominal duration of the ramp can be substantially 0.25 ms and the duration greater than the nominal duration can be substantially 1 ms.

Be that as it may, the nominal durations of the ramps and plateaus are chosen in such a way that having regard to their variations, the duration of a write operation remains lower than a guaranteed maximum duration.

When the value of the supply voltage lies between substantially 1.6V and substantially 5.5V and the step value can be substantially 2.5V.

According to another aspect there is proposed a memory device intended to be supplied by a supply voltage and comprising at least one memory slot of the electrically programmable and erasable read-only memory type, and write cycle controller configured to increase the duration of the write cycle in the presence of a decrease in the supply voltage.

According to one embodiment, the controller is configured to increase the duration of the write cycle by at least one step corresponding respectively to at least one step value of the supply voltage lower than a nominal value.

According to one embodiment, the controller comprises at least one comparator for comparing the current value of the supply voltage with the at least one step value.

According to one embodiment, the at least one comparator is configured to carry out at least one comparison before the beginning of the write cycle.

According to one embodiment, the device comprises a write circuit comprising a pulse generator for generating at least one erasure or programming pulse, and the controller is configured to increase the duration of the write cycle by increasing the duration of the at least one pulse.

According to one embodiment, the pulse generator is configured to generate an erasure pulse followed by a programming pulse, and the controller is configured to increase the duration of the write cycle by increasing the duration of each pulse.

According to one embodiment, the pulse generator is configured to generate pulses comprising a voltage ramp followed by a plateau, and the controller is configured to increase the duration of the pulse by increasing the duration of the corresponding ramp.

The controller can be configured to increase the duration of the pulse by increasing the duration of the corresponding plateau.

The controller can be configured to generate the plateau at a decreased value if the duration of the plateau is increased.

According to one embodiment, the controller is configured to generate the ramp for a duration fixed at a nominal duration if the supply voltage is greater than the step value and for a duration greater than the nominal duration if the supply voltage is lower than the step value.

The value of the supply voltage can lie between substantially 1.6V and substantially 5.5V and the step value can be substantially 2.5V.

BRIEF DESCRIPTION OF THE DRAWINGS

Other advantages and characteristics of the invention will become apparent on examining the detailed description of wholly non-limiting modes of implementation and embodiments, and the appended drawings in which.

DETAILED DESCRIPTION OF ILLUSTRATIVE EMBODIMENTS

Figure 1:
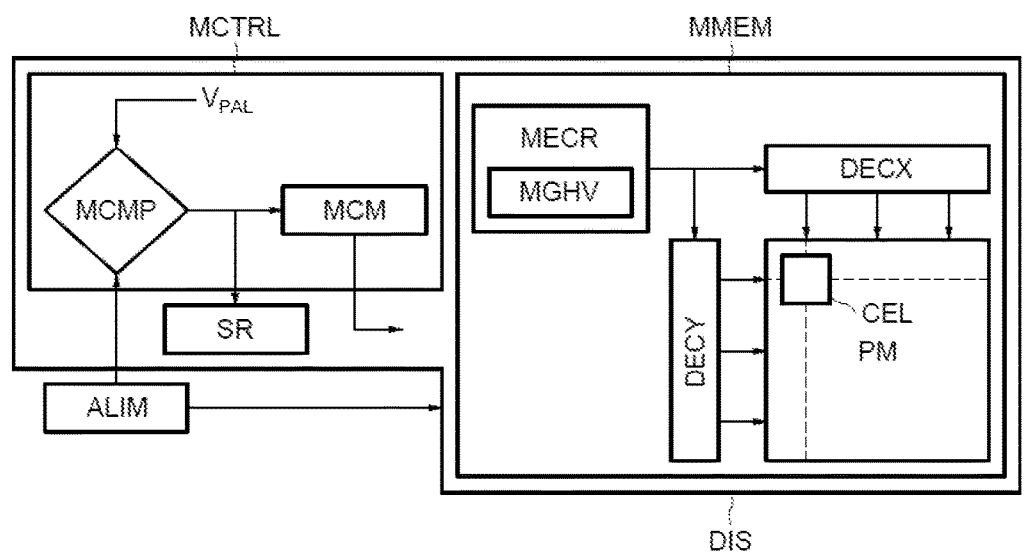
FIGS. 1 to 5 schematically illustrate various modes of implementation and embodiments of the invention.

FIG. 1 schematically represents a memory device DIS of EEPROM type according to the invention.

This device DIS is supplied by a power supply ALIM comprising for example a cell or a battery, and comprises a storage unit MMEM and a controller MCTRL.

The storage unit MMEM comprise a memory plane PM of memory slots CEL, in addition conventionally to row and column decoders DECX and DECY, and a write circuit MECR, of conventional structures known per se.

The write circuit MECR comprises, in particular, a pulse generator for generating high-voltage pulses MGHV comprising in particular a ramp generator based for example on an analog integrator, several charge pump stages, an oscillator, and the associated regulation.

The regulation makes it possible to control the output voltage of the charge pump. The oscillator is halted when the output of the charge pump exceeds a high reference. The output voltage of the charge pump then begins to decrease because of the charge. As soon as the output voltage of the charge pump is lower than a low reference, the oscillator restarts. The voltage disparity between the low and high references (hysteresis) ensures stability. This voltage difference is for example of the order of 100 millivolts.

The ramp is generated by virtue in particular of the analog integrator comprising a capacitor, charged by a constant current, and followed by a voltage follower.

The ramp can also be generated by the regulation of the charge pump itself. Indeed, the regulation voltage can itself be of the shape of a ramp.

As indicated previously, the duration of the pulse (ramp+plateau) is driven by an analog or digital chronometer ("timer").

By way of indication, a digital chronometer can comprise a fixed frequency oscillator connected to a counter. The counter starts when the charge pump starts and the end of the counting marks the end of the pulse.

The characteristics of the plateau (duration, voltage) are in particular determined by the chronometer and a setpoint value.

The controller MCTRL comprises a comparator MCMP and a driver MCM comprising, for example, logic circuitry of conventional structures in particular capable of driving various elements of the controller MCTRL and storage unit MMEM, in particular elements of the write circuit MECR.

The comparator MCMP comprises, for example, a comparator circuit of conventional structure, capable in particular of comparing the value of the supply voltage with a control value, or step value, VPAL.

The comparator MCMP is also capable of transmitting the result of the comparison to the driver MCM, or of storing it for example in a register SR.

As a function of the result of the comparison of the supply voltage Vdd with the step value VPAL, the driver MCM adjust in particular the values of the currents and the capacitances of the capacitors of the analog integrator and of the charge pump regulation, the frequency of the oscillator, or else the term of the counting of the counter, so that the pulse generator generates the pulse according to a longer or shorter duration.

More precisely, if the comparator MCMP indicates a supply voltage greater than the step value VPAL, then the driver MCM will increase the values of the ramp generator currents, and/or decrease the capacitances of the capacitors charged by the currents.

Such adjustments translate into a decrease in the duration of generation of the ramp.

Conversely, if the comparator MCMP indicates a supply voltage lower than the step value VPAL, then the driver MCM will decrease the value of the ramp generator currents, and increase the capacitances of the capacitors charged by the currents.

Such adjustments translate into an increase in the duration of generation of the ramp.

The variations of the currents and capacitances are carried out in a conventional manner, respectively by acting on ratios of current mirrors and by swapping capacitors, for example.

Moreover, the driver can increase the duration of the plateau, in particular by decreasing the frequency of the oscillator and by increasing the term of the counting of the counter.

The driver MCM can also decrease the voltage of the plateau, by decreasing for examples the high and low references of the charge pump regulator.

According to a preferential mode of implementation and embodiment, the plateau is generated for a duration proportional to the duration of generation of the corresponding ramp.

Other conventional circuits which are present in the memory device DIS and which are not indispensable to the understanding of the invention have intentionally not been represented in FIG. 1 for the sake of simplification.

The various profiles of the pulses arising from the pulse generator MGHV will be studied in greater detail hereinafter.

In particular, FIGS. 2A to 5 represent profiles of pulses generated by one and the same configuration of the pulse generator MGHV, but driven by the driver MCM for various supply voltages Vdd, and various modes of implementation or embodiments of the invention.

Hereinafter, the charge pump is in particular dimensioned to generate short-duration pulses via a supply voltage greater than the step value in an efficient manner and according to a consumption of the write operation compatible with the fan-out of the charge pump.

This dimensioning also makes it possible to generate long-duration pulses via a low supply voltage in an efficient manner and according to a consumption of the write operation compatible with the fan-out of the charge pump.

Figure 2A:
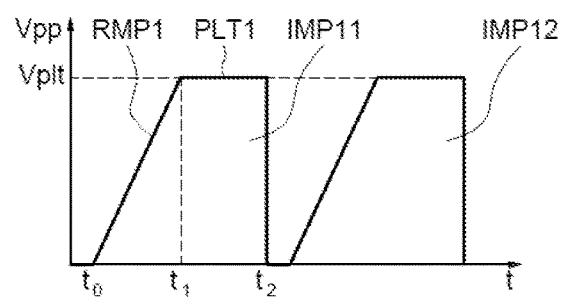

FIG. 2A illustrates profiles of pulses corresponding to an exemplary short-duration write cycle via a supply voltage Vdd greater than the step value VPAL.

In this example, the write operation is carried out by an erasure pulse IMP11 followed by a programming pulse IMP12.

Each pulse IMP11, IMP12 exhibits a ramp RMP1 followed by a plateau PLT1 typically at a nominal level Vplt of 15 volts.

By way of indication, the duration of the write operation can be for example 1 ms, and each pulse IMP11, IMP12 can be substantially of the same duration (t2-t0) of the order of 0.5 ms with equal durations (t1-t0) of the ramp RMP1 and (t2-t1) of the plateau PLT1 of the order of 0.25 ms.

Of course, for one and the same duration of the write operation or cycle, for example 1 ms, the pulses IMP11, IMP12 could exhibit ramps and/or plateaus of various durations and/or of various values.

According to one aspect of the invention, a decrease in the supply voltage Vdd below the step value VPAL engenders an increase in the duration of the write cycle.

Figure 2B:
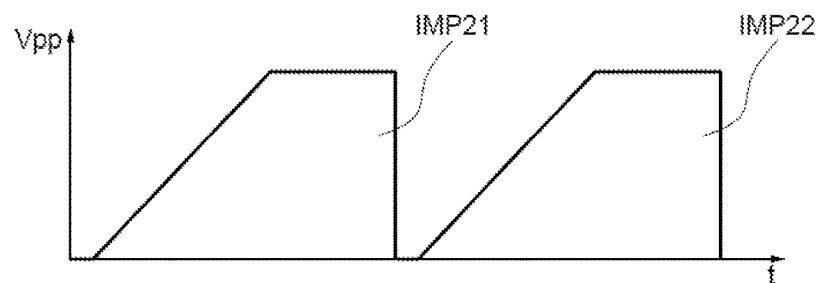

FIG. 2B illustrates profiles of pulses corresponding to a write cycle whose duration has been increased, in a situation where the supply voltage Vdd is lower than the step value VPAL.

By way of indication, in this situation, the duration of the write operation can be for example 4 ms, and the erasure pulse IMP21 and programming pulse IMP22 can be substantially of the same duration.

Figure 3:
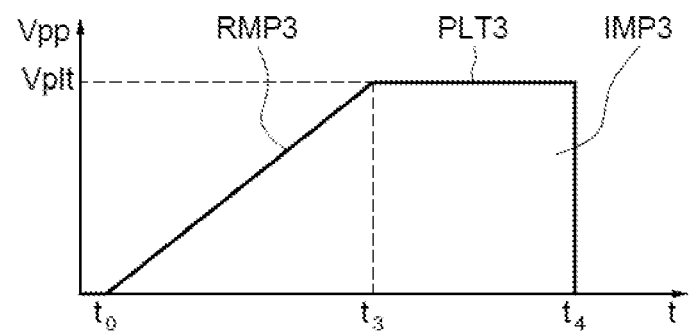
Figure 4:
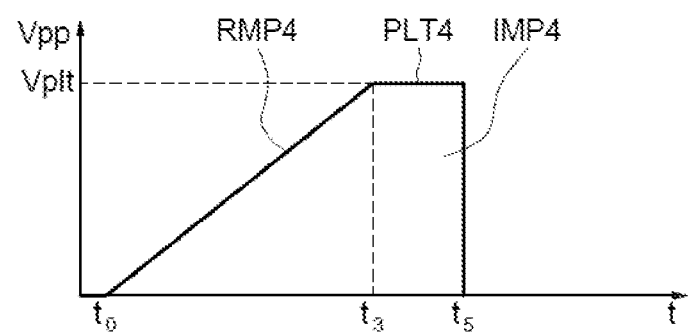
Figure 5:
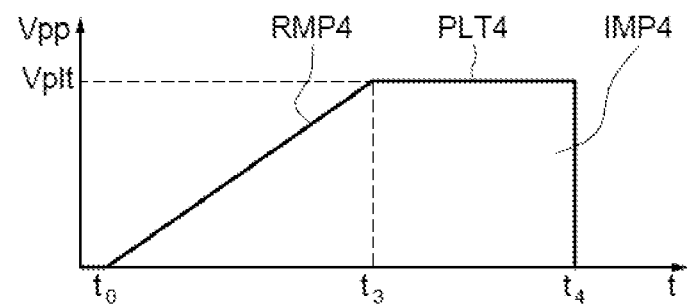

The pulses IMP21, IMP22 can exhibit, according to the embodiments or modes of implementation of the invention, ramps and/or plateaus of various durations and/or of various values as will be detailed in FIGS. 3 to 5.

FIG. 3 illustrates a pulse IMP3 that may be either an erasure pulse or a programming pulse, exhibiting a ramp RMP3 followed by a plateau PLT3 typically at a nominal level Vplt of 15 volts.

This pulse IMP3 exhibits an increased duration of the ramp RMP3 and duration of the plateau PLT3 with respect to the pulses represented in FIG. 2A.

By way of indication, the duration of the pulse IMP3 (t4-t0) can be 2 ms, and the durations (t3-t0) of the ramp RMP3 and (t4-t3) of the plateau PLT3 are substantially equal, with a possible value of about 1 ms.

FIG. 4 illustrates a pulse IMP4 that may be either an erasure pulse or a programming pulse, exhibiting a ramp RMP4 followed by a plateau PLT4 typically at a nominal level Vplt of 15 volts.

This pulse IMP4 exhibits a duration of the ramp RMP4 which is increased and a duration of the plateau PLT4 which is not increased with respect to the pulses represented in FIG. 2A.

By way of indication, the duration of the pulse IMP4 (t5-t0) can be about 1.25 ms, and the durations (t3-t0) of the ramp RMP4 and (t5-t3) of the plateau PLT4 can be respectively about 1 ms and 0.25 ms.

FIG. 5 illustrates a pulse IMP5 that may be either an erasure pulse or a programming pulse, exhibiting a ramp RMP5 followed by a plateau PLT5 at a level Vplt'.

This pulse IMP5 exhibits an increased duration of the ramp RMP3 and of the plateau PLT5, and a decreased value of the plateau, with respect to the pulses represented in FIG. 2A. The value Vplt' of the plateau PLT5 is lower than the value Vplt of the plateaus of the previous embodiments, and can be for example 14V.

By way of example, the duration of the pulse IMP5 (t4-t0) can be about 2 ms, and the durations (t3-t0) of the ramp RMP5 and (t4-t3) of the plateau PLT5 are substantially equal, with a possible value of about 1 ms.

The invention is not limited to the modes of implementation and embodiments which have just been described but embraces all variants thereof.

Thus, the erasure and programming pulses may respectively not be identical as regards duration of ramp, amplitude, duration of the plateau, or total duration.

Likewise it is possible to envisage an increase in the duration of the plateau without increasing the duration of the ramp, and a decrease in the voltage of the plateau, for example with the aim of reducing static consumption.

What is claimed is:

1. A method of controlling a cycle for writing data to a memory cell of an electrically programmable and erasable read-only memory device disposed in an electronic circuit supplied by a supply voltage, the method comprising:
   providing a first write cycle with a first pulse having a first pulse duration, the first pulse comprising a first voltage ramp having a first ramp duration and further comprising a first plateau that is immediately after the first voltage ramp and that has a first plateau duration that is about the same as the first ramp duration;
   monitoring the supply voltage; and
   providing a second write cycle with a second pulse by increasing a second pulse duration of the second pulse in response to a decrease in the supply voltage, the second pulse comprising a second voltage ramp having a second ramp duration longer than the first ramp duration and further comprising a second plateau that is immediately after the second voltage ramp and that has a second plateau duration that is longer than the first plateau duration and that is about the same as the second ramp duration.

2. The method according to claim 1, wherein the increasing the second pulse duration of the second write cycle comprises increasing the second pulse duration by a step corresponding respectively to a step value of the supply voltage lower than a nominal value.

3. The method according to claim 2, wherein monitoring the supply voltage comprises comparing a current value of the supply voltage with the step value.

4. The method according to claim 3, wherein the comparing is carried out before beginning the second write cycle.

5. The method according to claim 2, wherein the supply voltage lies between about 1.6V and about 5.5V and the step value is about 2.5V.

6. The method according to claim 1, wherein the providing the first write cycle comprises generating the first pulse.

7. The method according to claim 1,
   wherein increasing the second pulse duration comprises increasing the second pulse duration by a step corresponding respectively to a step value of the supply voltage lower than a nominal value;
   wherein monitoring the supply voltage comprises comparing a current value of the supply voltage with the step value;
   wherein providing the second write cycle comprises generating the second pulse as an erasure or programming pulse, and wherein increasing the second pulse duration comprises increasing a duration of the erasure or programming pulse;
   and wherein the second ramp duration of the second voltage ramp is fixed at a nominal duration if the supply voltage is greater than the step value and is greater than the nominal duration if the supply voltage is lower than the step value.

8. A method of controlling a cycle for writing data to a memory cell of an electrically programmable and erasable read-only memory device disposed in an electronic circuit supplied by a supply voltage, the method comprising:
providing a first write cycle by generating a first pulse that is one of an erasure or programming pulse, the first pulse comprising a first voltage ramp having a first ramp duration and further comprising a first plateau that is immediately after the first voltage ramp and that has a first plateau duration that is about the same as the first ramp duration;
monitoring the supply voltage;
generating a comparison result according to a comparison, by a controller, of a value of the supply voltage to a step value signal received at the controller; and
providing a second write cycle having a second pulse that is one of an erasure or programming pulse, including increasing, by the controller, a second pulse duration of the second pulse in response to the comparison result indicating a decrease in the value of the supply voltage below the step value signal by increasing a second ramp duration of a second voltage ramp of the second pulse to be longer than the first ramp duration, and further by increasing a second plateau duration of a second plateau of the second pulse to be longer than the first plateau duration and to be about the same as the second ramp duration.

9. The method according to claim 8, wherein the second write cycle comprises an erasure step followed by a programming step, the erasure step comprising a generation of an erasure pulse and the programming step comprising generation of a programming pulse, wherein increasing the second pulse duration comprises increasing a duration of the erase pulse and the programming pulse.

10. The method according to claim 8, wherein increasing the second pulse duration of the second pulse comprises decreasing a value of the second plateau.

11. A memory device comprising:
a supply voltage node for carrying a supply voltage;
an electrically programmable and erasable read-only memory cell; and
a write cycle controller configured to provide a first write cycle with a first pulse having a first pulse duration, the first pulse comprising a first voltage ramp having a first ramp duration and further comprising a first plateau that is immediately after the first voltage ramp and that has a first plateau duration that is about the same as the first ramp duration, the write cycle controller further configured to generate a comparison result according to a comparison, by the write cycle controller, of a value of the supply voltage to a step value signal received at the write cycle controller, the write cycle controller further configured to provide a second write cycle with a second pulse by increasing a second pulse duration of the second pulse in response to the comparison result indicating a decrease in the value of the supply voltage below the step value signal, the increasing the second pulse duration including increasing a second ramp duration of a second voltage ramp of the second pulse to be longer than the, and further by increasing a second plateau duration of a second plateau of the second pulse to be longer than the first plateau duration and to be about the same as the second ramp duration.

12. The memory device according to claim 11, wherein the write cycle controller is configured to increase the second pulse duration by at least one step corresponding respectively to at least one step value of the supply voltage lower than a nominal value and corresponding to the step value signal.

13. The memory device according to claim 12, wherein the write cycle controller comprises a comparator configured to compare a current value of the supply voltage with the at least one step value.

14. The memory device according to claim 13, wherein the comparator is configured to carry out a comparison before the second write cycle has begun.

15. The memory device according to claim 11, further comprising a write circuit comprising a pulse generator, which is configured to generate the second pulse, which comprises an erasure pulse or a programming pulse.

16. The memory device according to claim 15, wherein the pulse generator is configured to generate the second write cycle with an erasure pulse followed by a programming pulse, and wherein the write cycle controller is configured to increase the second pulse duration by increasing a duration of the erasure pulse and the programming pulse.

17. The memory device according to claim 15, wherein the write cycle controller is configured to generate the second plateau at a decreased value when the second plateau duration of the second plateau is increased.

18. The memory device according to claim 11, wherein the write cycle controller is configured to increase the second pulse duration by at least one step corresponding respectively to at least one step value of the supply voltage lower than a nominal value;
wherein the write cycle controller comprises a comparator configured to compare a current value of the supply voltage with the at least one step value;
wherein the memory device further comprises a write circuit comprising a pulse generator configured to generate the second pulse, which comprises an erasure pulse or a programming pulse as the second pulse; and
wherein the write cycle controller is configured to generate the second voltage ramp for a second voltage ramp duration fixed at a nominal duration if the supply voltage is greater than the step value and for a second voltage ramp duration greater than the nominal duration if the supply voltage is lower than the step value.

19. The memory device according to claim 18, wherein the supply voltage lies between about 1.6V and about 5.5V and the step value is about 2.5V.

20. The method according to claim 8, wherein the supply voltage lies between about 1.6V and about 5.5V and a step value of the step value signal is about 2.5V.

21. The method of claim 1, wherein the increasing the second pulse duration is performed in response to a comparison of a value of the supply voltage to a received step value signal indicating the decrease in the supply voltage.

* * * * *